(12) United States Patent
Turvey et al.

(10) Patent No.: US 6,759,835 B2
(45) Date of Patent: Jul. 6, 2004

(54) SWITCH CONTROL CIRCUIT

(75) Inventors: Simon Turvey, Birmingham (GB); Adrian Shipley, Dudley (GB)

(73) Assignee: Goodrich Control Systems, Ltd., Luton (GB)

( * ) Notice: Subject to any disclaimer, the term of this patent is extended or adjusted under 35 U.S.C. 154(b) by 33 days.

(21) Appl. No.: 10/322,721

(22) Filed: Dec. 19, 2002

(65) Prior Publication Data
US 2003/0117817 A1 Jun. 26, 2003

(30) Foreign Application Priority Data
Dec. 21, 2001 (GB) .............................................. 0130754

(51) Int. Cl.[7] .............................................. G05F 1/40
(52) U.S. Cl. .................................................... 323/282
(58) Field of Search ................................ 323/282, 283, 323/284, 285, 351; 363/50

(56) References Cited

U.S. PATENT DOCUMENTS

| | | | | | |
|---|---|---|---|---|---|
| 4,325,021 A | * | 4/1982 | McMackin | .................. | 323/351 |
| 4,544,878 A | * | 10/1985 | Beale et al. | ................ | 323/315 |
| 4,553,082 A | * | 11/1985 | Nesler | ......................... | 323/288 |
| 4,575,673 A | * | 3/1986 | Tedeschi et al. | ............ | 323/351 |
| 5,130,883 A | * | 7/1992 | Edwards | ..................... | 361/91.1 |
| 5,726,505 A | * | 3/1998 | Yamada et al. | ............. | 307/127 |
| 5,912,552 A | * | 6/1999 | Tateishi | ...................... | 323/285 |

* cited by examiner

*Primary Examiner*—Adolf Berhane
(74) *Attorney, Agent, or Firm*—Hunton & Williams LLP

(57) ABSTRACT

A switching circuit controls at least one semiconductor switch TR1 using drive signals generated from logic circuitry 4 that generates complementary drive signals on an upper and lower drive path. Validation circuitry is provided between the logic circuitry and the semiconductor switch that inhibits any uncontrolled switching of the semiconductor switch TR1 due to noise, such as lightning strike, appearing at the load.

11 Claims, 5 Drawing Sheets

SWITCH CONTROL CIRCUIT

Figure 1:
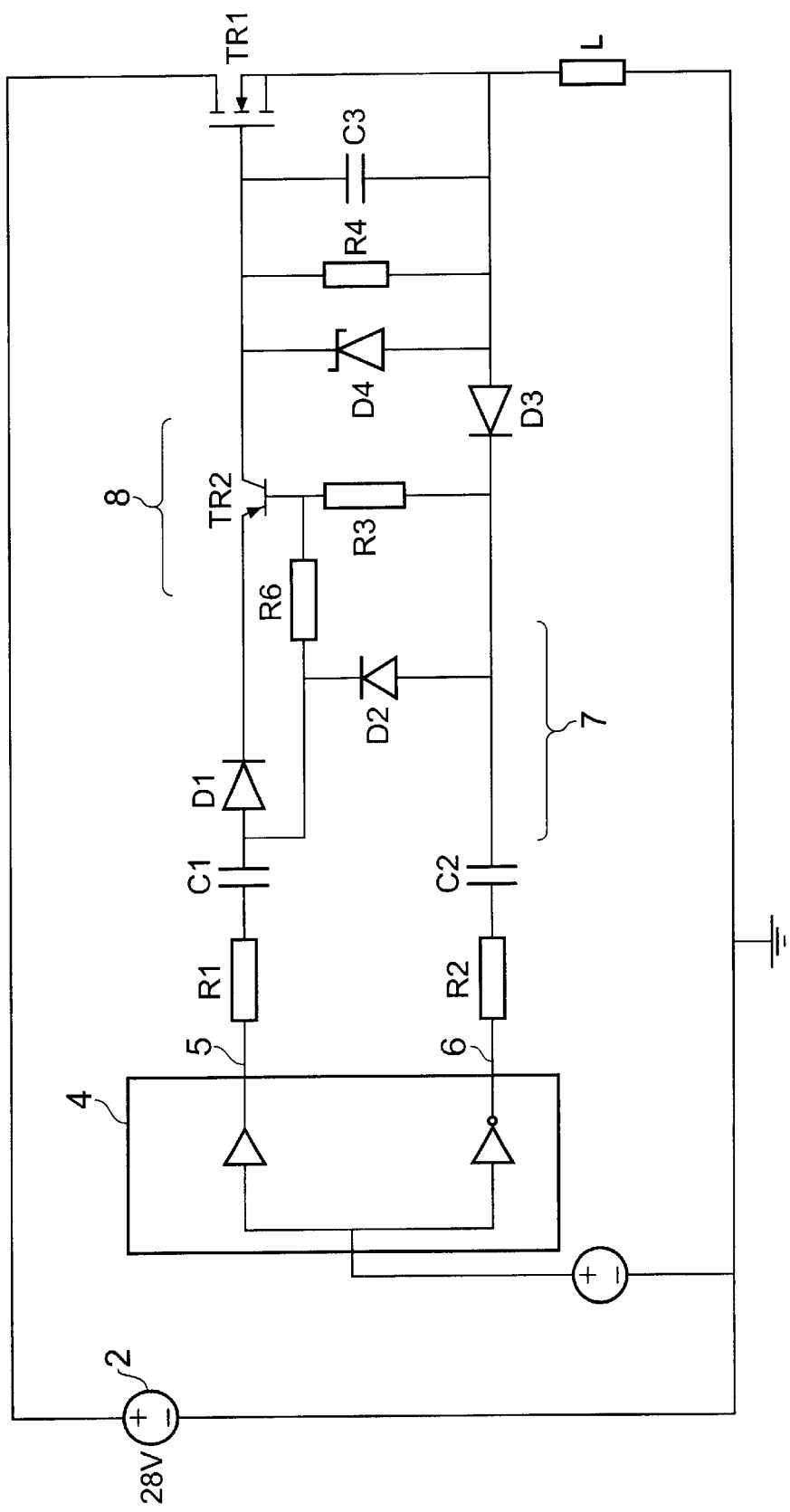

The present invention relates to a control circuit for a least one semiconductor switch in which uncontrolled switching of the semiconductor switch due to the presence of noise is inhibited.

There are many applications in which it is desirable to switch a voltage or load using a control signal. A common use of such a switching arrangement is to switch a supply voltage on and off to an external or internal load. An occurrence of this application is within the aerospace industry. Previously it was well known to accomplish such switching using an electromechanical relay. However, the electromechanical relay has been replaced in many applications by semiconductor switches to achieve the higher reliability, lower cost, and ease of manufacture that semiconductor switches offer.

The use of semiconductor switches as replacements for a mechanical relay can however also pose problems when a semiconductor switch not directly connected to a common ground or supply rail is required. When using such a floating "high side" semiconductor switch it is desirable to limit as far as possible spurious or uncontrolled switching of the semiconductor switch due to the presence of noise. Although such noise isolation may be achieved using wound or optically isolated semiconductor switches, such devices are ordinarily prohibitively expensive and complex for most applications. A known approach has therefore been developed that makes it possible to drive a floating "high side" power semiconductor switch whilst avoiding transformers, opto-isolators or individual DC to DC derived supplies. This known approach involves deriving a control voltage that is applied to the semiconductor switch using a charge pump. As it is necessary that the switching circuit does not rely on the output load or supply for its operation, it is necessary to use a differential drive method to derive the control voltage. Using this arrangement, it is known to provide a capacitive separation barrier to provide some noise isolation and DC blocking between the differential drive circuit and the overall power supply. The use of such a capacitive separation barrier allows the semiconductor switch and its control circuitry to float with respect to DC or low frequency AC voltage, whilst the power and control signals are transferred in a higher frequency domain.

The problem with capacitive separation alone is if large amplitude AC signals are present on the supply line or load they can cause spurious turn on of the semiconductor switch, or more problematically, can prevent the semiconductor switch from turning off. This is a problem on DC systems but is even more acute with high voltage AC supplies, such as 115V 400 Hz AC supplies commonly found in aerospace applications.

Further problems associated with floating semiconductor switches are the inductively induced switching transients that can cause breakdown of the semiconductor switch. On DC systems it is possible to deal with load transients by means of freewheeling diodes, but this is generally not an optimal solution. Furthermore, freewheeling diodes do not control line-based transients produced when the switched supply either has a long run of cabling or is derived from a transformer rectifier unit (TRU). On AC systems, freewheeling diodes are not applicable and either active or passive snubbing is required to avoid uncontrolled avalanche conditions in the power switch elements.

The alternative is to accommodate such line and load induced transients using the semiconductor switch itself to actively limit the transient voltages and capacitive input current surges or absorb inductive energy. Such a protection scheme has the advantage of high speed inductive load switching, thus providing a closer approximation of relay type operation. However, the problem with this form of self-protection is that it may not provide adequate protection against lightning strikes. The ability of a semiconductor switch to absorb the energy contained in a lightning strike is limited by, first the physical size of the semiconductor switch and second the required clamping voltage. These limitations means that, in certain safety critical applications, the semiconductor switches would have to be vastly over-rated to provide the necessary self-protection, leading to increased costs and physical size of the circuits.

According to the present invention there is provided a control circuit for at least one first semiconductor device, the circuit comprising: a rectifier circuit having first and second inputs and arranged to generate a control signal for the at least one first semiconductor device when the first and second inputs are driven in anti-phase; and a validation circuit coupled to said rectifier circuit and the or each first semiconductor device, said validation circuit being arranged to inhibit uncontrolled switching of the or each first semiconductor device in the presence of noise.

The provision of a validation circuit interposed between the rectifier circuit and the semiconductor switch inhibits uncontrolled switching of the or each semiconductor device, which preferably acts as a switch. A further advantage is that the use of additional devices is avoided to provide protection against lightning strikes.

Preferably the validation circuit comprises a second semiconductor device arranged to allow charge flow to a charge store only when an alternating voltage difference between the first and second inputs of the rectifier circuit exceeds a first threshold. It is therefore possible to provide a control circuit that exhibits good common mode noise rejection because only differential voltages are permitted to be conducted by the validation circuit.

Preferably, the charge store is connected to a control terminal of the or each first semiconductor switch. The charge store provides a time delay in switching off or on the or each first semiconductor switch that tends to counteract any uncontrolled operation of the semiconductor switch.

Preferably, the or each first semiconductor switch is a field effect transistor. FET's provide a cost effective solution whilst exhibiting good switching characteristics, and low "ON" resistance.

Preferably, the first and second inputs of the rectifier circuit are high pass filtered. This further improves the noise rejection capabilities of the circuit.

Preferably, the validation circuit is arranged such that a negative voltage transient, for example due to a lightning strike, applied to the or each first semiconductor switch biases said second semiconductor device off. The validation circuit is therefore arranged to actively bias the second semiconductor device off in the event of a negative voltage strike, thus preventing uncontrolled turn on of the field effect transistor. Additionally, the validation circuit may further comprise a third semiconductor device arranged such that a positive voltage transient, for example due to a positive lightning strike, applied to the or each first semiconductor device biases the third semiconductor device off. The validation circuit therefore provides controlled protection of the field effect transistor in the event of both negative and positive transients which may arise as a result of lightning strikes.

Preferably, the control circuit further includes an inductive load protection circuit for modifying the rate of turn off of the or each first semiconductor switch so as to limit the voltage appearing across the switch when switching loads having a significant imaginary component as part of the load impedance.

Additionally, the protection circuit may comprise a unidirectional current flow path connection between a control terminal of the or each first semiconductor switch and a node formed between a capacitor and a resistor, a capacitor being in connection with a first terminal of the semiconductor switch and the resistor being in connection with a second terminal of the semiconductor switch.

It is therefore possible to additionally provide both absolute voltage clamping and rate of change of voltage clamping when switching inductive loads without the use of freewheeling diodes.

Figure 2:
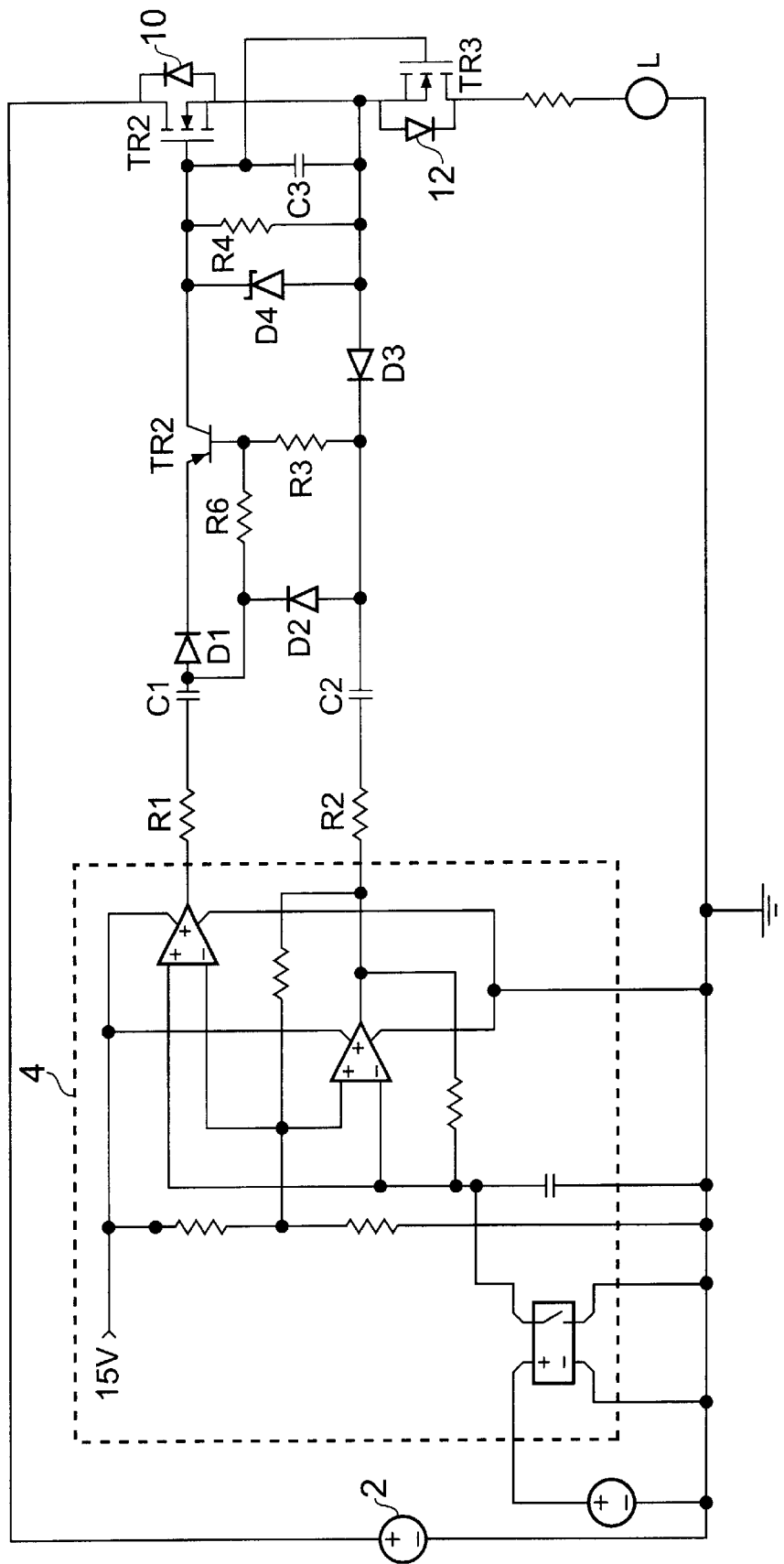
Figure 3:
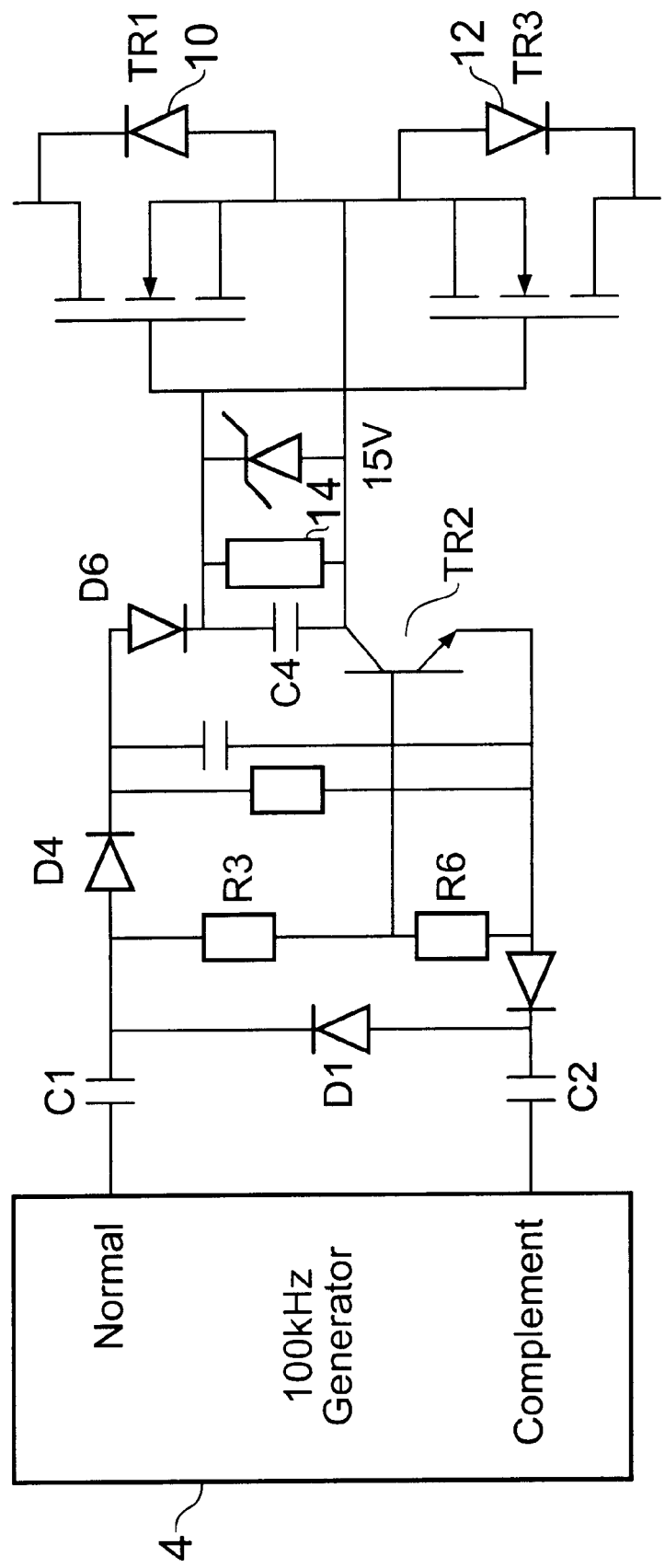
Figure 4:
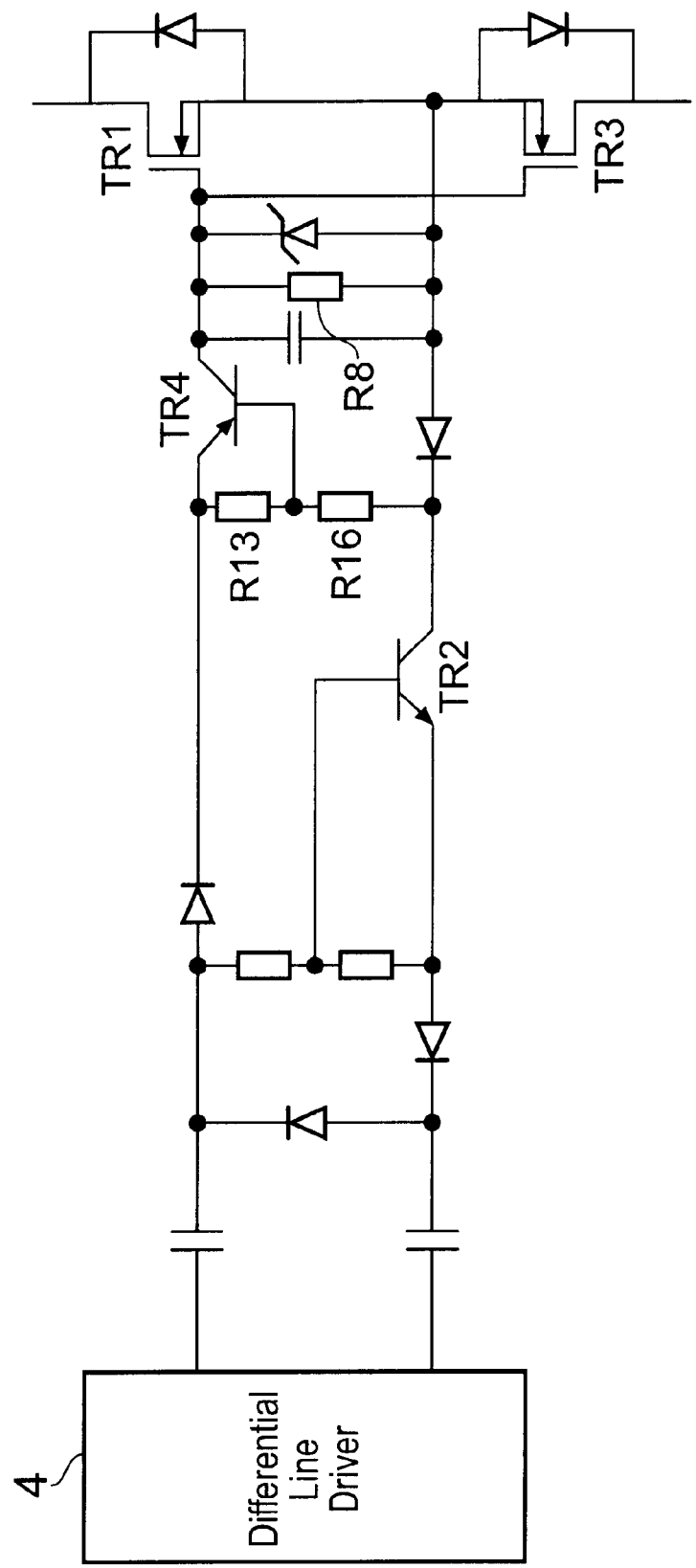
Figure 5:
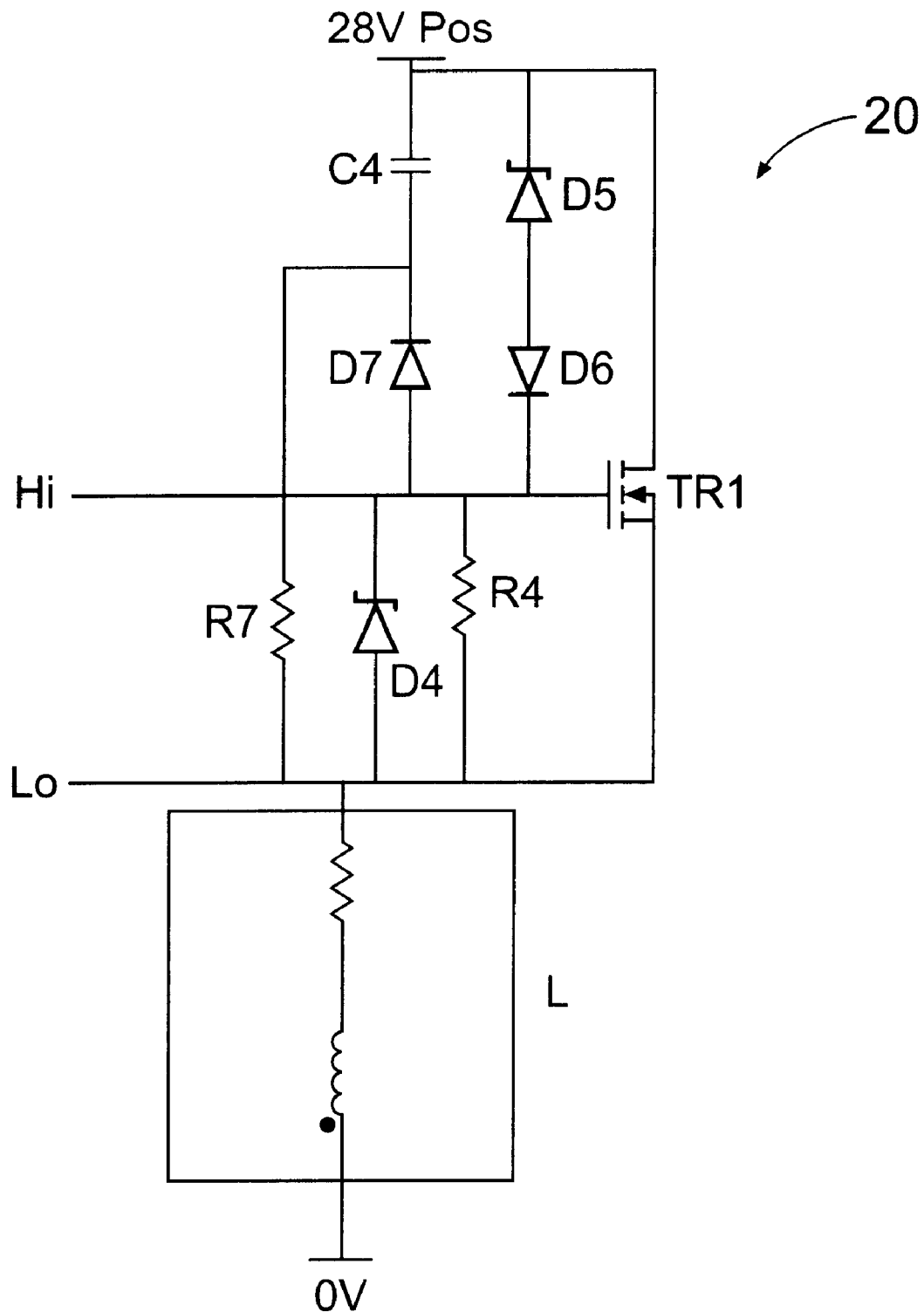

Embodiments of the present invention are described herein below, by way of example only, with reference to the accompanying figures, in which:

FIG. 1 schematically illustrates a DC control circuit according to the present invention that provides common mode noise rejection;

FIG. 2 schematically illustrates a further example of an AC control circuit according to the present invention that provides common mode noise rejection;

FIG. 3 schematically illustrates a control circuit according to the present invention providing noise protection against negative lightning strikes;

FIG. 4 schematically illustrates a control circuit according to the present invention providing noise protection against both positive and negative lightning strikes; and FIG. 5 illustrates a voltage clamping circuit in accordance with embodiments of the present invention.

FIG. 1 illustrates a control circuit according to an embodiment of the present invention. In this embodiment, first semiconductor switch TR1 is used to switch a DC voltage provided by the DC power supply 2 to the load L. A logic circuit 4 is arranged to provide complementary oscillating drive signals on upper and lower drive paths 5 and 6, whenever it is desired to turn TR1 on. The anti phase signals from the logic circuit 4 pass through serially connected capacitors and resistors C1/R1 and C2/R2 and are rectified at a rectifier, generally indicated 7, using diodes D2 and D1 to produce, under no load conditions, a 10V-2 Diode Drop square wave signal at the cathode of D1 relative to D2. A validation circuit 8 comprising further transistor TR2 is arranged to conduct the pulsed drive signal to the control terminal of the semiconductor switch TR1 only when the polarity and magnitude of the voltage at the cathode of D1 with respect to D2 is correct. In this particular embodiment TR1 is a field effect transistor. The second transistor is a PNP bipolar transistor having its emitter connected to the cathode of D1 and its collector connected to the gate of TR1. The base of transistor TR2 is connected to the output of a voltage divider formed by resistors R6 and R3 connected in series between the anode of D1 and a cathode of a further diode D3 whose anode is connected to a node formed by TR1 and the load. The resistors R6 and R3 are also in parallel with D2. Due to this arrangement, only voltages that present a voltage across the diode D2 connected between the upper and lower drive paths are rectified and therefore only such differential voltages are translated into a switching action by R6 and R3, allowing transistor TR1 to conduct.

The control signal output from the collector of TR2 to the gate (ie a control terminal) of the first transistor TR1 is stored in a charge storage capacitor C3 which is in parallel with a discharge resistor R4 so that the charge store discharges in a controlled way. A zener diode is provided in parallel with the charge store to provide protection against over voltage conditions. The capacitor C3 is shown as a discrete component. However, in some embodiments of the present invention the storage capacitor can be formed by parasitic capacitance such as that associated with the gate of a field effect transistor.

The advantage exhibited by the embodiment shown in FIG. 1 is that because only differential voltages applied across diode D2 cause switching of field effect transistor TR1, the circuit rejects any common mode noise.

A further embodiment of this circuit is shown in FIG. 2. In this particular embodiment the main power supply 2 is an AC supply and it is therefore necessary to provide a second field effect transistor, TR3, in the switching path of the load L. It is necessary to provide two field effect transistors for switching the alternating supply because the parasitic diodes 10, 12 of transistors TR1 and TR3 respectively, formed because of the diffusion between the drain and source of the device, mean that the MOSFET structure is not symmetrical. In the example shown in FIG. 2, the basic circuit of the differential charge pump, i.e. R1/C1 and R2/C2 is the same as that illustrated in FIG. 1 and this functions in the same way. However, the logic circuit 4 is shown as comprising a simple oscillator, configured around a dual op-amp to provide the differential clock, the clock being gated by a switch. It will be appreciated that other alternatives exist for the logic circuit 4 and that the specific arrangement of the logic circuit 4 does not form a part of the present invention.

FIG. 3 illustrates a further embodiment providing increased noise immunity. As in the previous embodiments, logic circuitry 4 provides complementary drive signals to capacitors C1 and C2. A voltage divider comprising resistors R3 and R6 is also provided between the normal and complementary drive signals. However, in the circuit shown in FIG. 3, the semiconductor switch, TR2 is now placed in the lower drive path, as opposed to the upper drive path in FIGS. 1 and 2. Transistor TR2 is now an NPN transistor as opposed to a PNP transistor shown in FIGS. 1 and 2. The remainder of this circuit is analogous to that shown in FIGS. 1 and 2. As before, common mode noise rejection is provided because only differential voltages applied across D1 cause TR2 to be conductive and therefore to allow switching to occur at transistors TR1 and TR3. However, in addition the circuit shown in FIG. 3 provides improved noise immunity. Consider the case that a negative voltage transient caused by a lightning strike occurs on either drain of the output field effect transistors. The negative spike would pass through the parasitic diodes 10, 12 of the transistors and be applied to the collector of the first NPN transistor TR2. As will be appreciated by those skilled in the art, the NPN transistor TR2 can be considered to be formed of two diodes, a first diode being connected between the base and collector and a second diode being connected between the base and the emitter, with both anodes being connected to the base. Hence the negative voltage spike will pass freely in the reverse direction through the base/collector diode but is blocked by the base/emitter diode. The negative voltage then passes through resistor R3 and in the reverse direction through diode D1. The voltage dropped across diode D1 means that the upper drive path is more negatively charged by the noise spike than the lower drive path. This means that the base-emitter of transistor TR2 is reverse biased and is therefore actively held off, thus preventing the field effect transistors TR1 and TR3 from being switched on.

Further circuit protection is provided because the negative spike must flow through at least one of the voltage divider resistors R3 and R6, thus limiting the magnitude of current flow.

Should the field effect transistors TR1 and TR3 have been switched on at the point of the lightning strike occurring, the negative voltage appearing at the gates of the transistors TR1 and TR3 will cause them to turn off and for the behaviour of the circuit to be the same as just previously described. However, the output of the field effect transistors will remain on for at least 200 μs due to the time constant created by the 20 Kohm resistor 14 and 10 nF capacitor C4. A lightening strike is usually less than 200 μs therefore its effect would not be seen. If the pulse were longer than 200 μs, then the FETS would turn off.

Should a positive transient as a result of a lightning strike occur, the diodes D4 and D6 in the upper drive path block the path of the positive voltage. As the base/emitter voltage of transistor TR1 is fixed, then the positive pulse will simply raise the collector voltage towards its maximum acceptable limit, because the transistor is behaving as a constant current device at this particular point in time. The positive voltage is prevented from travelling past the diodes in the upper drive path, and hence the switching voltage applied to transistor TR1 is unaffected and the circuit therefore behaves as normal.

FIG. 4 illustrates a further embodiment of the present invention that provides improved noise immunity against both negative and positive voltage strikes. The circuit is analogous to that shown in FIG. 3 with the addition of a further PNP transistor TR4 in the upper drive path. Additional transistor TR4 is switched using a voltage divider comprising resistors R13 and R16 in an analogous manner to NPN transistor TR2. The PNP transistor TR4 can also be considered to comprise of two diodes with their cathodes both connected to the base of the PNP transistor TR4 and their anodes being connected to the emitter and collector respectively. Should a positive lightning strike occur at either of the field effect transistors TR1 and TR3 when those transistors are off, the diode formed between the collector and base of the PNP transistor TR4 will be forward biased and conduct the positive voltage. However, the NPN transistor TR2 and the other diodes in the circuit prevent the positive voltage from propagating any further to the left of the circuit. The net effect is that the base of the PNP transistor TR4 is driven positive by the lightning strike and is thus therefore maintained in the off condition, thus maintaining the field effect transistors TR1 and TR3 in the off condition. The PNP transistor TR4 will completely block a negative lightning strike and prevent negative voltage from passing any further to the left of the circuit. A negative lightning strike would maintain the field effect transistors TR1 and TR3 in their off state.

Should a positive lightning strike appear at either the gate or the source of the field effect transistors TR1 and TR3 whilst they are in their on state, then the PNP transistor TR4 will be turned off because, as explained above, the positive strike will propagate through to the base of the PNP transistor, therefore turning it off. As the NPN transistor TR2 has a fixed base/emitter voltage, the positive pulse will simply raise the collector voltage of transistor TR2, as this transistor is effectively a constant current device at this time. The circuit functionality will therefore remain unchanged and the threat to the logic drive circuit 4 will be within acceptable limits.

Should a negative lightning strike appear at either the gate or the source of the field effect transistors TR1 and TR3 whilst they are on, then the collector/emitter voltage increases. As the PNP transistor TR4 is also acting as a constant current source, the gate/source voltage of the field effect transistors TR1 and TR3 remain unchanged because the current through resistor R8 connected between the gates of transistor TR1 and TR3 remains the same. Thus the circuit operation is unaffected.

FIG. 5 schematically illustrates an embodiment of the present invention in which additional circuitry is provided to the switching circuit of the previously described embodiment, the additional circuitry being provided to allow large reactive loads to be switched by the circuit and hence can be regarded as an inductive load protection circuit 20. Only the field effect transistor TR1, resistor R4 and diode D4 of the switching circuit is shown in FIG. 5. The remainder of the circuitry is as shown in the previous diagrams. Diodes D5 and D6 are connected in series and with reverse polarity to each other between the gate of the field effect transistor TR1 and a supply voltage. Diodes D5 and D6 provide absolute voltage clamping that prevents the voltage at the source of the field effect transistor from exceeding a preset level. The rate of change of voltage with time across transistor TR1, referred to as Dv/Dt, is also controlled using the additional components R7, D7 and C4. D7 and C4 are connected in series between the transistor gate and drain, with resistor R7 being connected between the lower path and the junction of the capacitor C4 and diode D7. A suitable selection of values for the circuit components enables the turn off of large reactive loads whilst maintaining the previously described lightning strike protection. A small amount of let through, that is supply voltage appearing at the output, is permitted with this circuit arrangement. In this embodiment C3 has been omitted and the parasitic capacitance of the circuit functions as the storage capacitor.

It is thus possible using embodiments of the present invention to provide a switching circuit for a semiconductor switch that has improved noise immunity and that can be used for switching reactive loads.

What is claimed is:

1. A control circuit for at least one first semiconductor device, the circuit comprising:
   a rectifier circuit having first and second inputs and arranged to generate a control signal for the at least one first semiconductor device when the first and second inputs are driven in anti phase; and
   a validation circuit coupled to said rectifier circuit and the or each first semiconductor device, and in which said validation circuit is arranged to inhibit uncontrolled switching of the or each first semiconductor device in the presence of noise.

2. A control circuit as claimed in claim 1, wherein the validation circuit comprises a second semiconductor device arranged to allow charge flow to a charge store only when an alternating voltage difference between the first and second inputs of said rectifier circuit exceeds a threshold.

3. A control circuit as claimed in claim 2, wherein the charge store is connected to a control terminal of the or each first semiconductor device.

4. A control circuit as claimed in claim 1, wherein the or each first semiconductor device is a charge controlled device.

5. A control circuit as claimed in claim 1, wherein the first and second inputs of said rectifier circuit are high pass filtered.

6. A control circuit as claimed in claim 2, wherein said validation circuit is arranged such that a negative voltage transient applied to the or each first semiconductor device biases said second semiconductor device off.

7. A control circuit as claimed in claim 2, wherein said validation circuit further comprises a third semiconductor device arranged such that a positive voltage transient applied to the or each first semiconductor device biases said third semiconductor device off.

8. A control circuit as claimed in claim 1, further including an inductive load protection circuit for modifying the rate of turn off of the or each first semiconductor device so as to limit the voltage appearing across the device when switching loads having a significant imaginary component as part of the local impedance.

9. A control circuit as claimed in claim 8, in which the protection circuit comprises a uni-directional current flow path connection between a control circuit of the first semiconductor device and a node formed between a capacitor and a resistor, the capacitor being in connection with a first terminal of the first semiconductor device and the resistor being in connection with a second terminal of the first semiconductor device.

10. A control circuit as claimed in claim 1, wherein said validation circuit comprises at least one impedance arranged to limit reverse current flow at said rectifier circuit inputs during transient voltage conditions.

11. A control circuit as claimed in claim 2, wherein the first semiconductor device is a field effect transistor and the charge store is formed by parasitic capacitance associated with a gate of the field effect transistor.

* * * * *